United States Patent
Singh et al.

(10) Patent No.: US 6,625,802 B2
(45) Date of Patent: Sep. 23, 2003

(54) METHOD FOR MODIFYING A CHIP LAYOUT TO MINIMIZE WITHIN-DIE CD VARIATIONS CAUSED BY FLARE VARIATIONS IN EUV LITHOGRAPHY

(75) Inventors: Vivek K. Singh, Portland, OR (US); John Ernst Bjorkholm, Pleasanton, CA (US); Francisco A. Leon, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 92 days.

(21) Appl. No.: 10/061,615

(22) Filed: Feb. 1, 2002

(65) Prior Publication Data

US 2003/0149956 A1 Aug. 7, 2003

(51) Int. Cl.⁷ .............................................. G06F 17/50
(52) U.S. Cl. ............................ 716/21; 716/1; 716/14
(58) Field of Search ...................................... 716/1–21

(56) References Cited

U.S. PATENT DOCUMENTS

| | | | | |
|---|---|---|---|---|
| 6,111,646 A | * | 8/2000 | Naulleau et al. | 356/494 |
| 6,118,535 A | * | 9/2000 | Goldberg et al. | 356/521 |
| 6,195,169 B1 | * | 2/2001 | Naulleau et al. | 356/498 |
| 6,233,056 B1 | * | 5/2001 | Naulleau et al. | 356/520 |
| 6,239,879 B1 | * | 5/2001 | Hay | 358/1.15 |

OTHER PUBLICATIONS

Krautschik et al., "Rigorous modeling of scattered light in EUV cameras" Microprocesses and Nanotechnology Conference, 2001 International, Oct. 31–Nov. 2, 2001, pages(s): 14.*

Singh, "The importance of layout density control in semiconductor manufacturing"www.eda.org/edps/edp03/submissions/paperVivek2.pdf.*

* cited by examiner

Primary Examiner—Matthew Smith
Assistant Examiner—Andrea Liu
(74) Attorney, Agent, or Firm—Blakely, Sokoloff, Taylor & Zafman LLP

(57) ABSTRACT

A method including determining a first flare convolution based on a feature density of projected structures on a substrate layout, determining a second flare convolution based on a mask for a given substrate layout, determining a system flare variation by summing the first flare convolution and the second flare convolution, and determining a critical dimension variation based on the system flare variation.

15 Claims, 4 Drawing Sheets

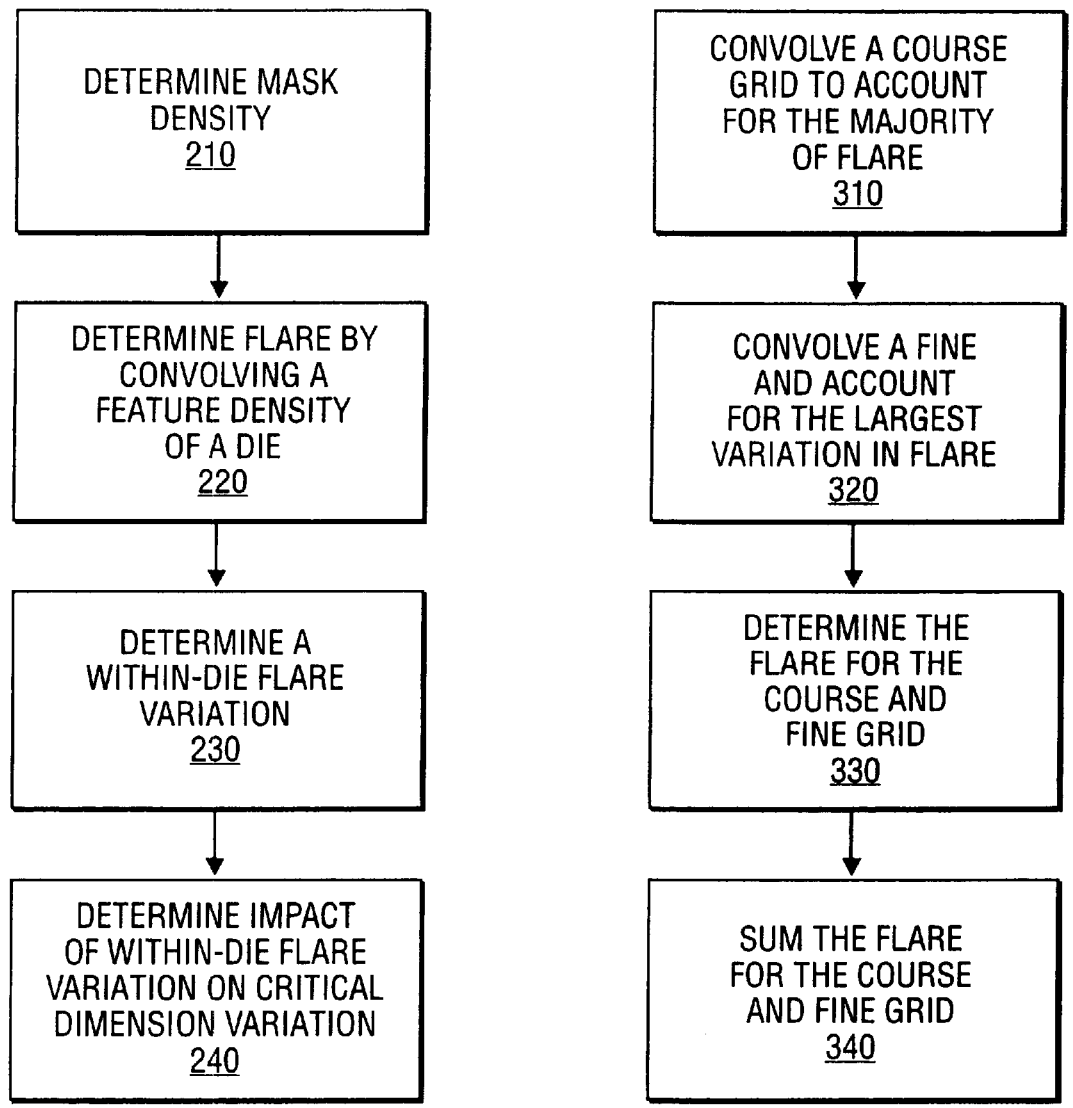

METHOD FOR MODIFYING A CHIP LAYOUT TO MINIMIZE WITHIN-DIE CD VARIATIONS CAUSED BY FLARE VARIATIONS IN EUV LITHOGRAPHY

FIELD

The invention relates to circuit patterning and more particularly to patterning using extreme ultra-violet lithography.

BACKGROUND

Patterning is the series of steps that results in the removal of selected portions of surface layers added on a substrate such as a wafer. Patterning creates the surface parts of devices that make-up a circuit. One goal of patterning is to create in or on the wafer surface, the parts of the device or circuit in the exact dimensions (feature size) required by the circuit design and to locate the parts in their proper location on a wafer surface. Generally speaking, patterning sets the critical dimension of devices of a circuit.

Generally, patterning is accomplished through photolithography techniques. In general, photolithography is a multi-step pattern transfer process whereby a pattern contained on a reticle or photomask is transferred onto the surface of a wafer through a lithographic imaging step, including the development of a light sensitive material (e.g., photoresist) on the wafer. In general, the smallest feature printable by the imaging system is proportional to the following quantity:

$$\frac{\lambda}{NA}$$

where $\lambda$ is the wavelength of light used in imaging the mask onto the wafer and NA is the numerical aperture of the projection optics.

One goal of circuit designers is to reduce the feature size (the critical dimension) of devices of a circuit, i.e., reduce the smallest feature patternable. A reduction in wavelength of light used in patterning will reduce the smallest feature patternable as will an increase in the numeral aperture of the lens. Unfortunately, an increase in the numerical aperture of the lens tends to be quite expensive. Thus, the recent trend has been to reduce the wavelength. Currently, wavelengths of light used in patterning integrated circuits are 248 nanometers or less for a critical dimension on the order of 130 nm. As the critical dimension approaches 100 nanometers or less, the wavelength will be reduced to under 200 nanometers, and will eventually lie in the extreme ultraviolet (EUV) region.

In the general course of patterning, the image of a reticle or photomask is projected onto a wafer by an imaging system. Typically, the imaging system is refractive and is composed of lenses fabricated out of glass or quartz. EUV radiation, however does not pass through quartz or glass. Thus EUV imaging relies on reflective optics.

The short wavelengths used for imaging in EUV lithography raises a concern about flare. Flare is unwanted background light. It comes from locations away from the feature of interest and it reduces the printability of the image. Furthermore, variations of flare over the image cause unwanted changes in the printed size of critical features. Flare results from scattering off of imperfections on the mirror surfaces used as the optical elements of the EUV imaging system. There is a limit on how smooth the mirror surface can be, and even at the atomic level (e.g., three to four atoms), roughness in the mirror can cause significant light scattering. This light scattering leads to background illumination, called flare. This background illumination can be tolerated so long as it is not too large and is uniform across the wafer.

The flare at any location is a function of the surrounding mask layout. In general, a mask layout for a circuit design on a wafer is very complex and does not consist of a repeatable or uniform pattern. This variation in pattern layout results in non-uniform flare.

What is needed is a technique to determine a the variation of flare across the image; with this knowledge, techniques can be implemented to compensate for the non-uniformity of the flare.

BRIEF DESCRIPTION OF THE DRAWINGS

FIG. 2 is a block diagram for determining impact of within-die flare variation on critical dimension variation.

FIG. 3 is a block diagram of determining flare for a point on a wafer.

DETAILED DESCRIPTION

A technique for determining flare variation across the image of a die is disclosed. The technique involves evaluating the feature density (e.g., chrome feature density) on the mask on an appropriate grid. This feature density map is converted, through techniques elaborated herein, into a flare variation map. The knowledge of the flare variation allows the determination of a critical dimension (feature size) variation across the die, and subsequent compensation to minimize these critical dimension variations.

As described above, flare in reflective optics patterning (e.g., EUV wavelength optics) is generally the result of mirror roughness and its variation over the image of a die is due to non-uniform feature layout. One objective in mask patterning through reflective optics is to reduce within-die critical dimension variations due to flare. The technique described herein relates to determining a system flare and a critical dimension variation and then minimizing that variation by modifying the feature layout of an area of the substrate (e.g., an area of a chip or die on a wafer).

In order to determine the flare variation on a die of a wafer, the flare should be calculated at every point on the die. Flare is generally recognized as a far-field effect that can be represented by a point spread function (PSF).

To calculate flare at a given point in the die, an aerial image of the mask can be convolved with a point spread function for light scattering (flare). For one optical system, the PSF due to flare was defined by:

$$PSF = \frac{0.166}{r^{2.39}} \cdot \frac{1}{nm^2} \text{ for } r > 600 \text{ nm.}$$

Figure 1:
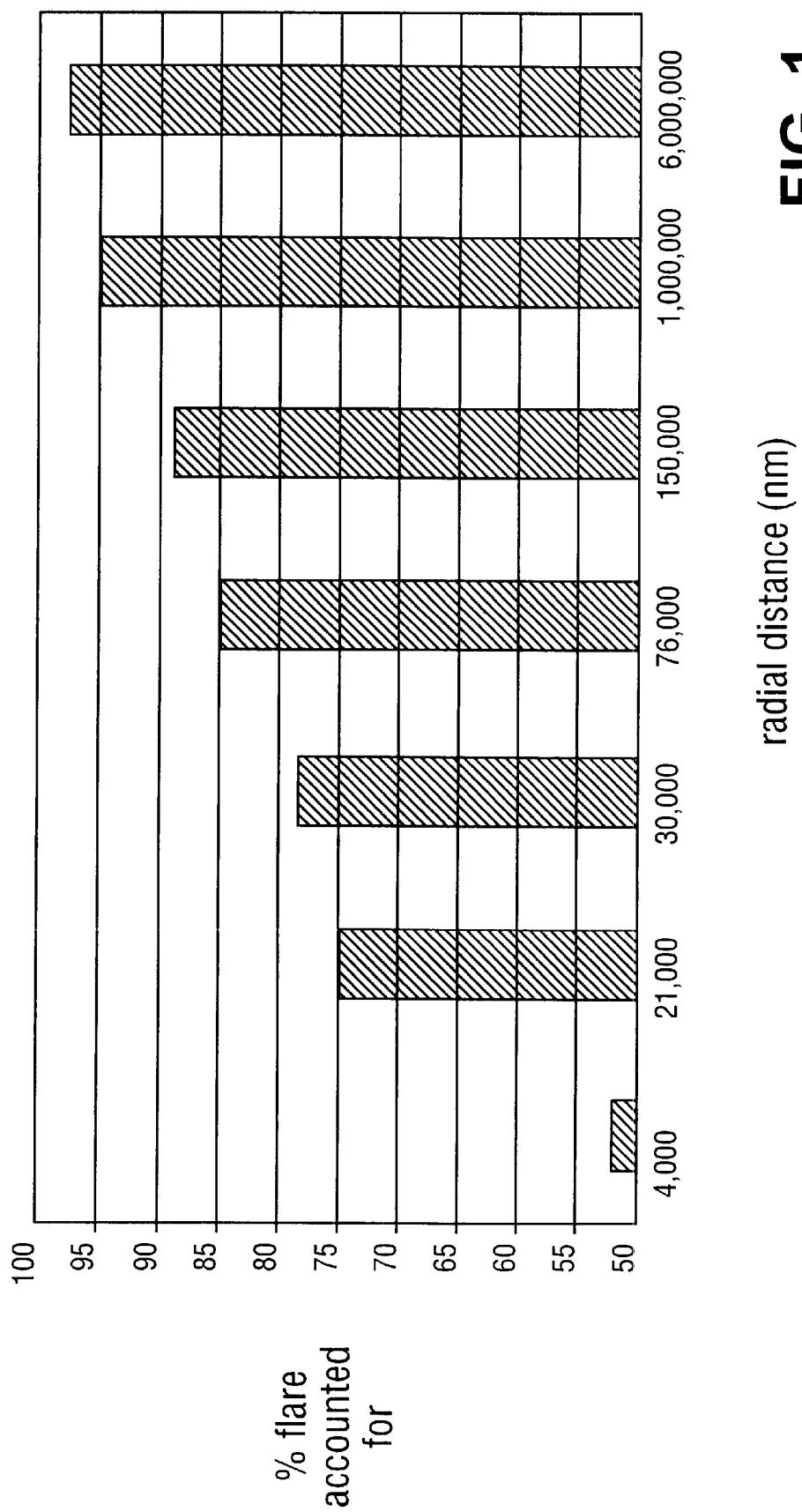
FIG. 1 shows a graphical representation of an analytical result of a flare calculation for an open frame mask in EUV patterning, assuming a certain level of mirror roughness (present in an existing EUV optical system).

FIG. 1 shows the analytical result of cumulative flare around a single point of the wafer graphed against the radial distance about this point. This calculation is for an open frame mask and is given by the equation:

$$\text{Flare} = \int_{600}^{\infty} 0.166 r^{-2.39} 2\pi r \, dr$$

According to the above equation and as illustrated in FIG. 1, flare is a far-field effect yielding a flare intensity contribution of about 0.19 normalized units from an area described by a radial distance of about 100,000 nm, and even this area accounts for only about 85 percent of the flare seen at a point on a wafer. It is a very computer intensive exercise to exactly calculate flare for every point on a die, especially if the convolution uses the aerial image of the mask, which itself must be calculated. Techniques to simplify the convolution to determine flare and its variation include convolving the mask, rather than the aerial image, with the PSF and, in greater simplification, to convolve a feature density of a selected grid of the mask with a PSF.

FIG. 2 describes one technique to determine flare at a point on a wafer (and thus a flare variation within a die of a wafer). First, flare is evaluated using the mask (e.g., reticle or photomask) rather than an aerial image of the mask (block 210). Such a convolution is done, for example by determining the chrome density of the mask (e.g., determining the percentage of area covered by chrome which is the unit mask less the quartz density).

Once the chrome density of the mask is determined, the feature density of the die is convolved with an appropriate grid with a PSF for real space or frequency space (block 220). With regard to a real space convolution, the flare may be representative according to the following:

$$f(x,y) = \int \int D(x_0, y_0) PSF(x-x_0, y-y_0) \bullet dx_0 dy_0.$$

With regard to frequency space, the flare may be represented according to the following equation, employing known mathematical notation involving Fourier transforms:

$$f = \text{Density}(x,y) \oplus PSF(x,y).$$

Due to peculiarities of the PSF, both methods require that the convolution be done on a very fine grid (1 micron or less) in order for the calculation to be accurate. This is impractical to carry out given the large number of pixels involved. One alternative method that can be utilized is the variable grid method, using a coarse grid where the variation of quantities is small, and a fine grid where such variation is large. However, this method is very cumbersome for the real space technique, and is ruled out by definition for the frequency space methods (which require a constant grid size). Thus, a technique is required to address this issue. The method described here essentially uses the frequency space method, but instead of doing the convolution in a single step with very fine grid, multiple convolutions are employed, each with a different, albeit uniform, grid.

Referring to FIG. 1 again, it is recognized that the majority of flare is contributed by points adjacent the point of measurement. In the example illustrated in FIG. 1, the largest contribution to flare is seen within about 20,000 nanometers of the point of measurement. Thus, in one embodiment described in FIG. 3, the majority of the flare about any point on a wafer is accounted for by convolving a feature density in frequency space about a selected area of the substrate. Such a convolution is done over multiple grids. For example, in one embodiment, a coarse grid is selected about a point by which an acceptable amount of the flare will be accounted for in coarse steps about a point (block 310). Representatively, such a grid is selected such that at least 80 percent and, preferably, 90 percent of the flare at a point on a substrate will be accounted for.

In addition to the selection of a coarse grid for determining flare, a fine grid is similarly established (block 320). In general, the fine grid flare evaluation recognizes that the largest contribution to flare at a given point comes from other points relatively close to the point of measurement. Therefore, the fine grid selection seeks to determine an amount of flare in fine steps about a point.

Having determined an appropriate coarse grid and fine grid for calculating flare convolutions, the technique includes determining an amount of flare (or a reasonable majority of the amount of flare) for a point on a die of a wafer for the coarse and fine grid (block 330). The total flare at that point is determined by summing the coarse grid flare convolution and the fine grid flare convolution (block 340) as shown below (for a specific set of values for coarse and fine grids):

$$\text{Flare} = PSF_{Fine} \oplus D_{Fine} + PSF_{coarse} \oplus D_{coarse}.$$

Referring to the example illustrated in FIG. 1, where flare at 600 microns was calculated to be 0.205 for a point on a substrate (accounting for about 85 to 90 percent of the open frame flare), using the technique described above with a selecting a coarse grid of 20 microns for a 0 to 600 micron grid and a fine grid of one micron for a 0 to 19 micron grid, the flare is calculated as follows for a 600 microns area:

$$PSF_1 \otimes D_1 = 0.153$$

$$PSF_{20} \otimes D_{20} = 0.051$$

$$\text{flare} = PSF_1 \otimes D_1 + PSF_{20} \otimes D_{20} = 0.204$$

The technique described simplifies the determination of flare at any point on a substrate by a superposition of two convolutions in frequency space each of a different grid, rather than a single convolution of the entire substrate. The technique provides a good approximation of the actual flare at a point without the computer intensive convolution required, for example, by an aerial image of the mask. It is appreciated that the above described technique is preferably implemented in a machine readable medium such as a computer-program.

Referring again to FIG. 2, by calculating the flare at points across a die of a wafer, a within-die flare variation can be calculated also preferably by implementing method in machine-readable means. In one embodiment, the goal may not be to eliminate the flare, but to make the flare uniform within a die across a wafer. In this regard, a commercial photolithography simulator may be used to determine the impact of within-die flare variation on the within-die critical dimension variation (block 230). An example of such a commercial simulator is Prolith, available from Finle Technologies, a division of KLA Tencor. Such a simulator treats flare at a given point as additional exposure superposed on the usual aerial image.

The allowable tolerance for critical dimension variation allows the variation of flare to be evaluated for an acceptable level (block 240). This, in turn, provides an allowed variation of feature density of a particular layout.

Figure 4:
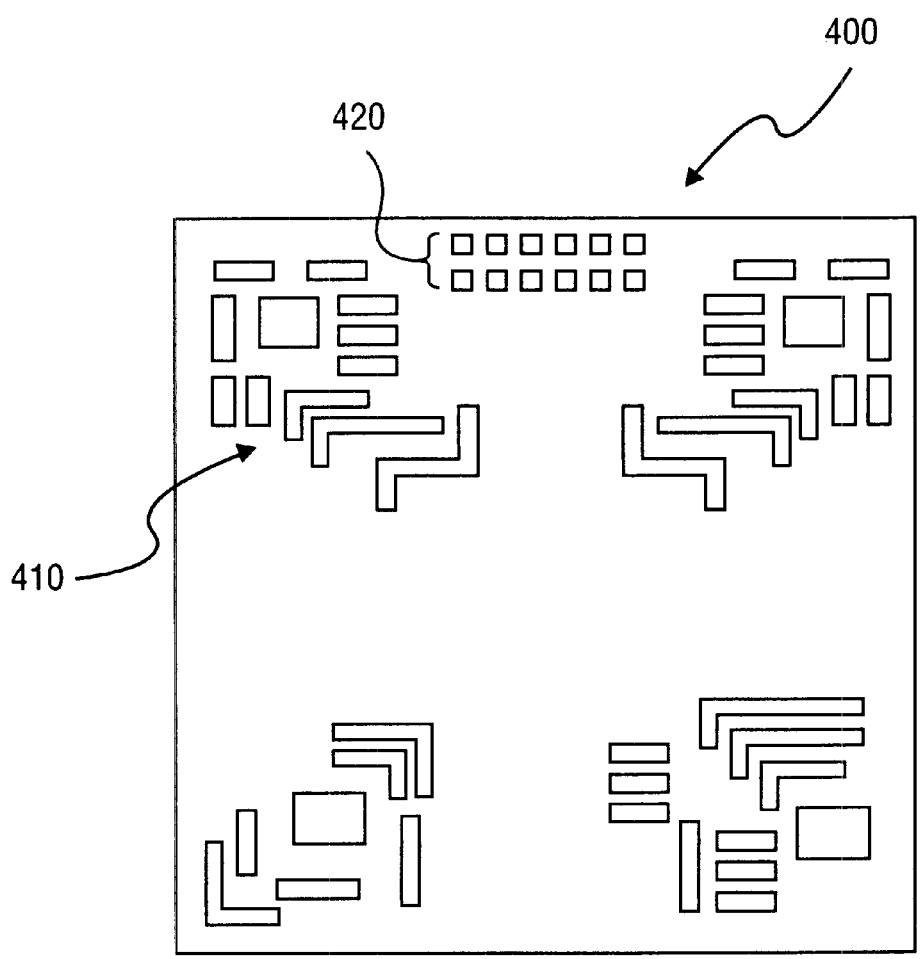
FIG. 4 illustrates a mask including auxiliary mask features on the mask to account for flare variations.

As noted above, feature density is a factor in flare. A non-uniform feature density on a die contributes significantly to the amount of flare at a given point on the die. To address the non-uniformity of feature density on a die, auxiliary or dummy features may be added to the layout. In one embodiment, such auxiliary features may be added by commercial layout tools, such as for example, CATS, commercially available from Numerical Technologies, Inc. The prior art addition of auxiliary features is primarily driven by a polishing (e.g., chemical mechanical polishing (CMP)) requirements, which dictate the size and placement of the auxiliary features. According to the embodiment described herein, the placement of the auxiliary features are controlled principally by flare-reduction criteria. The size of such auxiliary features may be specified such that they are below the resolution limit of the particular lithography system utilized. In this way, the auxiliary features can add energy for dark field masks or subtract energy for clear field masks to the flare background. As sub-resolution features, the auxiliary features would not have enough energy to produce unwanted features on the wafer. FIG. 4 shows an embodiment of a mask having auxiliary features introduced thereon to control flare. FIG. 4 shows a schematic portion of mask 400 having device features 410 and auxiliary features 420. With clear field masks, unwanted auxiliary features may be prevented from printing through a second exposure with a different mask, the second exposure exposing those areas in which the auxiliary features were patterned.

As described above, the quantity of interest in determining flare variation is chrome feature density averaged over a unit grid area. It is appreciated that the exact size of the features inside the grid area does not significantly affect the calculation. The chrome feature density can be increased in regions where it is low, by adding auxiliary chrome features. The size of the auxiliary features inside the grid can be arbitrarily chosen, so long as the features increase the density to the required level, and so long as an individual auxiliary feature is small enough that it does not print.

Figure 5:
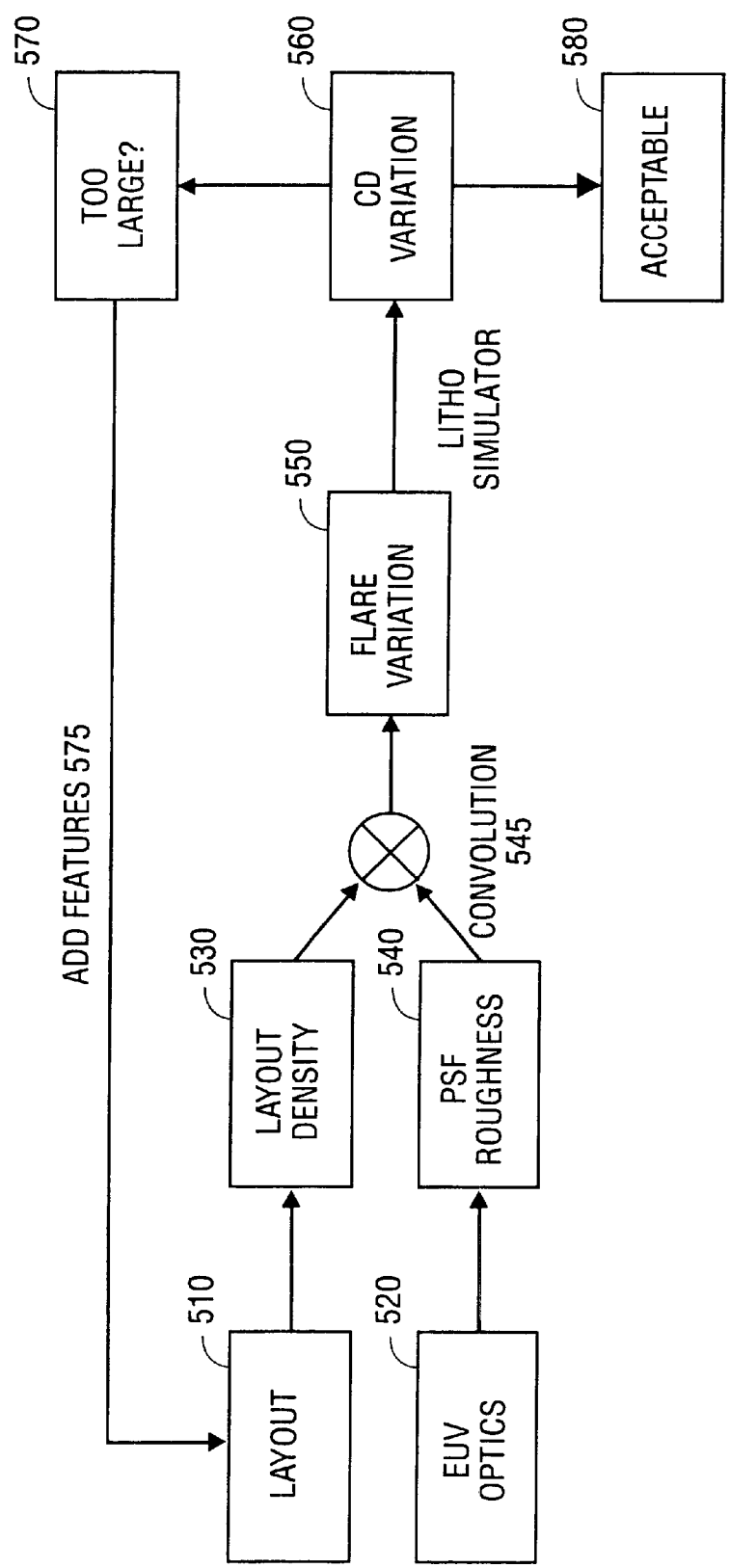
FIG. 5 is a block diagram for determining acceptable critical dimension variation.

FIG. 5 schematically illustrates a flow scheme for determining acceptable critical dimension variation in reflective optics (e.g., EUV) device patterning. Referring to FIG. 5, a layout (block 510) is selected for patterning using, for example, EUV optics (block 520). Flare is introduced as described above, principally by the layout density (block 530) and the mirror roughness (block 540). In one embodiment, the flare is accounted for at each point on a die of a wafer by a convolution of selected multiple grids in frequency space (block 545). The flare variation may be used to determine a critical dimension variation (block 560). If the critical dimension variation is unacceptable, e.g., too large (block 570) for a particular pattern, auxiliary features may be added to the die (block 575) and the flare, the flare variation (block 550), and the critical dimension variation (block 560) re-calculated until the critical dimension variation is acceptable (block 580).

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
   determining a first flare convolution based on a feature density of projected structures on a substrate layout, calculated on a coarse grid over a unit area;
   determining a second flare convolution based on a feature density of projected structures on a substrate layout, calculated on a fine grid over the unit area;
   determining a system flare variation by summing the first flare convolution and the second flare convolution; and
   determining a critical dimension variation based on the system flare variation.

2. The method of claim 1, wherein determining a first flare convolution comprises identifying a grid about a point on a substrate by which, at least 80 percent of flare seen by the point during a representative patterning operation.

3. The method of claim 2, wherein determining a first flare convolution and determining a second flare convolution each comprises a convolution for frequency space at the point on the substrate.

4. The method of claim 3, wherein determining a first flare convolution comprises determining a flare convolution within a selected minimal area about the point on the substrate and determining the second flare convolution comprises determining a flare within a selected maximum area about the point on the substrate.

5. The method of claim 1, further comprising determining whether the flare dimension variation is acceptable and, if not acceptable, adding a plurality of auxiliary mask features on the substrate.

6. The method of claim 5, wherein, if a plurality of auxiliary mask features are added on the substrate, the added mask features are below a resolution limit of a lithography system selected for forming structures on the substrate.

7. The method of claim 6, wherein a size of the plurality of auxiliary mask features is selected to minimize the flare dimension variation between points on the substrate.

8. The method of claim 5, further comprising if a plurality of auxiliary mask features are added on a substrate following a mask printing:
   removing the plurality of mask features.

9. A method comprising:
   determining a first convolution of a point spread function according to a first grid density of projected structures on a substrate, the first grid density selected to account for at least a majority of a flare variation about a point on the substrate;
   determining a second convolution of a point spread function according to a second grid density of projected structures on the substrate, the second grid density selected to account for at least a majority of a flare about a point on the substrate;
   determining a flare variation for an area of the substrate by adding a result of the first convolution and the result of the second convolution; and
   determining a critical dimension variation based on the flare variation.

10. The method of claim 9, further comprising determining whether the critical dimension variation is acceptable and, if not acceptable, adding a plurality of auxiliary mask features on the substrate.

11. The method of claim 10, wherein, if a plurality of auxiliary mask features are added on the substrate, the added mask features are below a resolution limit of a lithography system selected for forming structures on the substrate.

12. The method of claim 11, further comprising if a plurality of auxiliary mask features are added on a substrate following a mask printing:
   removing the plurality of mask features.

13. A machine readable storage media containing executable program instructions which when executed cause a digital processing system to perform a method comprising:
   determining a first convolution of a point spread function according to a first grid density of projected structures on a substrate, the first grid density selected to account for at least a majority of a flare variation about a point on the substrate;
   determining a second convolution of a point spread function according to a second grid density of projected structures on the substrate, the second grid density selected to account for at least a majority of a flare about a point on the substrate; and determining a flare variation for an area of the substrate by adding a result of the first convolution and the result of the second convolution.

14. The machine readable storage media of claim 13, wherein the method performed by a digital processing system further comprises:

determining a critical dimension variation based on the flare variation.

15. The machine readable storage media of claim 13, wherein the method of determining the first convolution and the second convolution comprises determining in a frequency space.

* * * * *